United States Patent
Yu et al.

(10) Patent No.: US 9,590,025 B2
(45) Date of Patent: Mar. 7, 2017

(54) TILED OLED DISPLAY AND MANUFACTURING METHOD THEREOF

(71) Applicant: SHENZHEN ROYOLE TECHNOLOGIES CO., LTD., Shenzhen (CN)

(72) Inventors: Xiaojun Yu, Shenzhen (CN); Peng Wei, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/688,485

(22) Filed: Apr. 16, 2015

(65) Prior Publication Data
US 2015/0221712 A1   Aug. 6, 2015

Related U.S. Application Data

(63) Continuation-in-part of application No. PCT/CN2012/083028, filed on Oct. 16, 2012.

(51) Int. Cl.
*H01L 27/32* (2006.01)

(52) U.S. Cl.
CPC ...... *H01L 27/3293* (2013.01); *H01L 27/3248* (2013.01); *H01L 27/3251* (2013.01);
(Continued)

(58) Field of Classification Search
CPC ............ H01L 27/3293; H01L 27/3253; H01L 27/3251; H01L 27/323; H01L 27/3276; H01L 27/3272; H01L 27/3248
(Continued)

(56) References Cited

U.S. PATENT DOCUMENTS

| 8,358,066 B1 * | 1/2013 | Aurongzeb ......... H01L 51/5253 313/506 |
| 8,610,155 B2 * | 12/2013 | Hatano ............... H01L 27/3251 257/59 |

(Continued)

FOREIGN PATENT DOCUMENTS

| CN | 1465038 | 12/2003 |
| CN | 1615057 | 5/2005 |

(Continued)

*Primary Examiner* — Caridad Everhart
(74) *Attorney, Agent, or Firm* — Hamre, Schumann, Mueller & Larson, P.C.

(57) ABSTRACT

The present invention is applicable to the field of display technologies and provides a tiled OLED display, and the tiled OLED display includes an OLED front panel and a single-structure TFT driving backplane, where a protection substrate is disposed on a light-emitting side of the OLED front panel; the OLED front panel includes multiple OLED front panel units that are tiled to each other; and the OLED front panel unit is joined to the TFT driving backplane by using conductive film. In the present invention, by tiling the OLED front panel on the TFT backplane, production efficiency and a yield rate of the display are improved, thereby reducing a cost. By tiling the OLED front panel, a tiling gap is narrowed, thereby implementing seamless tiling. Compared with a traditional structure that uses an optical lens to eliminate a tiling gap, the yield rate of the tiled display is improved. By joining the OLED front panel to the TFT driving backplane by using the conductive film, a display aperture ratio is improved, and a problem that it is difficult to control alignment precision and stability is poor is overcome.

13 Claims, 5 Drawing Sheets

(52) U.S. Cl.
 CPC ...... *H01L 27/3253* (2013.01); *H01L 27/3272* (2013.01); *H01L 27/3276* (2013.01); *H01L 2227/323* (2013.01)

(58) Field of Classification Search
 USPC .......................................................... 438/23
 See application file for complete search history.

(56) References Cited

U.S. PATENT DOCUMENTS

| | | |
|---|---|---|
| 2003/0173891 A1 | 9/2003 | Chiba et al. |
| 2005/0116616 A1 | 6/2005 | Koeda |
| 2008/0150437 A1 | 6/2008 | Iida et al. |
| 2010/0277064 A1* | 11/2010 | Cok .................... H01L 27/3293 313/506 |
| 2010/0315319 A1* | 12/2010 | Cok ........................ G09G 3/20 345/77 |
| 2011/0285273 A1* | 11/2011 | Albrecht ............... H01L 25/046 313/504 |
| 2012/0195426 A1* | 8/2012 | White .................... G06F 21/84 380/210 |

FOREIGN PATENT DOCUMENTS

| | | | | |
|---|---|---|---|---|
| CN | 102077385 | | 5/2011 | |
| CN | 102097448 | | 6/2011 | |
| EP | 2259322 | | 12/2010 | |
| KR | 2005039018 A | * | 4/2005 | ............. H01L 51/00 |

\* cited by examiner

TILED OLED DISPLAY AND MANUFACTURING METHOD THEREOF

TECHNICAL FIELD

The present invention relates to the field of display technologies and, in particular, relates to a tiled OLED display and a manufacturing method thereof.

BACKGROUND

Currently, due to the limitation of the size of a display component of various display technologies (such as PDP, LCD, and OLED), it is difficult to obtain a large-sized display of low cost and high yield. As a result, developments of high-performance and large-sized display technology is affected and applications of the display technology in the field of conference room, multimedia home platform, and outdoor advertisement is limited. The organic light-emitting diode (OLED) technology becomes an emerging display technology due to its advantages such as active light-emitting, ultra-thinness, low voltage, quick response, high brightness, and wider viewing angle. Numbers of products having OLED display of large-size and high-definition have already been launched to the flat panel market. A commonly-used OLED display manufacturing method is mainly as follows: an OLED light-emitting pixel unit is directly produced on a TFT drive substrate. However, it is difficult to produce a large-sized OLED light-emitting panel. Further, the cost is high. With the increase of size, the production cost of the OLED display will exponentially increase and the yield rate will decrease.

Another existing method of acquiring large-sized OLED display is to directly tile multiple displays which have ultra-narrow border. However, as the row/column scan drive circuit still exists on an edge of the each displays, "seamless" tiling still cannot be actually implemented. Another prior art is to adopt an optical lens array to magnify the displayed image to the border of each tiled display, so as to realize seamless display. However, the optical lens and the required precise alignment increase the manufacturing cost and decrease the yield rate, causing a more complex manufacturing process and a higher cost of a large-sized display component, together with a narrow viewing angle.

In conclusion, a large-sized tiled OLED display in the prior art still has a problem that it is difficult to eliminate a tiling gap and a yield rate is low.

SUMMARY

An objective of the present invention is to provide a tiled OLED display, aiming to implement seamless tiling of an OLED display, control cost, and improve yield rate of the display.

The present invention is implemented as follows: A tiled OLED display is provided, including an OLED front panel and a single-structure TFT driving backplane, where a protection substrate is further disposed on a light-emitting side of the OLED front panel. The OLED front panel includes multiple OLED front panel units that are tiled to each other. The OLED front panel unit is joined to the TFT driving backplane by conductive film.

Another objective of the present invention is to provide a method for producing a tiled OLED display, and the method includes the following steps: producing a single-structure TFT driving backplane and multiple OLED front panel units; attaching the multiple OLED front panel units to the TFT driving backplane by conductive film, so as to form a tiled OLED front panel on the TFT driving backplane; and disposing a protection substrate on a light-emitting side of the OLED front panel.

In the present invention, OLED front panel is acquired by tiling multiple OLED front panel units on a single-structure TFT driving backplane. Based on the yield rate of a small-sized OLED front panel unit is relatively high, the yield rate obtained by directly tiling the OLED front panel units is much higher than the yield rate obtained by producing a single OLED front panel of a same size on the TFT driving backplane. Therefore, in the present invention, production efficiency and yield rate of the tiled OLED display is improved, and the cost is substantially reduced.

In addition, the tiled OLED front panel eliminates tiling gaps caused by a row/column scan drive circuit of the TFT driving backplane, thereby greatly reducing impact on the display effect caused by tiling gaps, and implementing seamless tiling. Compared with a traditional structure that uses an optical lens to eliminate tiling gaps, the cost of the present application is reduced, and impact, of alignment precision of the lens, on the display effect is avoided, thereby improving the yield rate of the tiled OLED display.

Moreover, use of a contact partition wall is avoided by joining the OLED front panel to the TFT driving backplane by conductive film, thereby increasing an effective light-emitting area of the OLED front panel unit, improving a display aperture ratio, and improving the display effect. In addition, the conductive film improves the effective contact between the OLED front panel unit and the TFT driving backplane, thereby overcoming problems in the prior art that it is difficult to control alignment precision caused by hard contact of metal, assembling is difficult, and joint stability is poor; and extending a service life of the display. Furthermore, it is further favorable for producing a flexible display by joining the OLED front panel to the TFT driving backplane by using the conductive film.

DESCRIPTION OF EMBODIMENTS

To make the objectives, technical solutions, and advantages of the present invention clearer and more comprehensible, the following further describes the present invention in detail with reference to the accompanying drawings and embodiments. It should be understood that the specific embodiments described herein are merely used to explain the present invention but are not intended to limit the present invention.

The present invention will be described in detail in the following specific embodiments.

Figure 1:
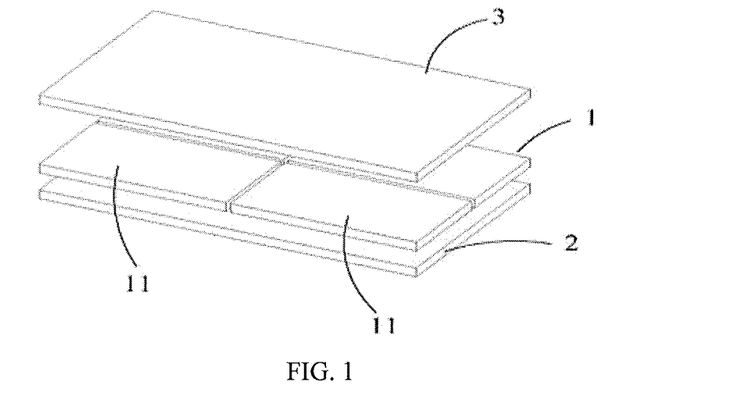
FIG. 1 is a schematic structure of a tiled OLED display according to an embodiment of the present invention.
Figure 2:
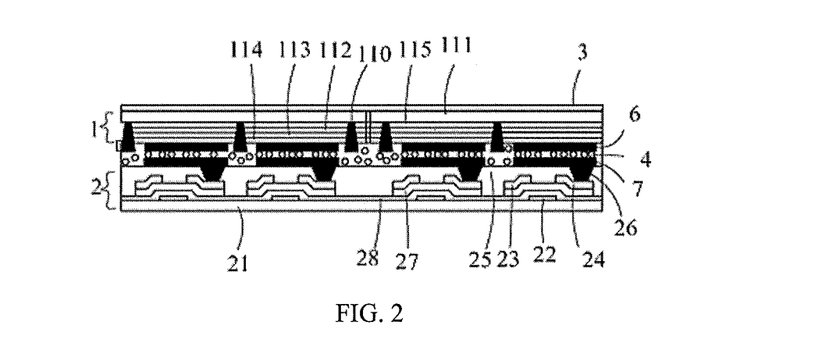
FIG. 2 is a side view of a first structure of a tiled OLED display according to an embodiment of the present invention.
Figure 3:
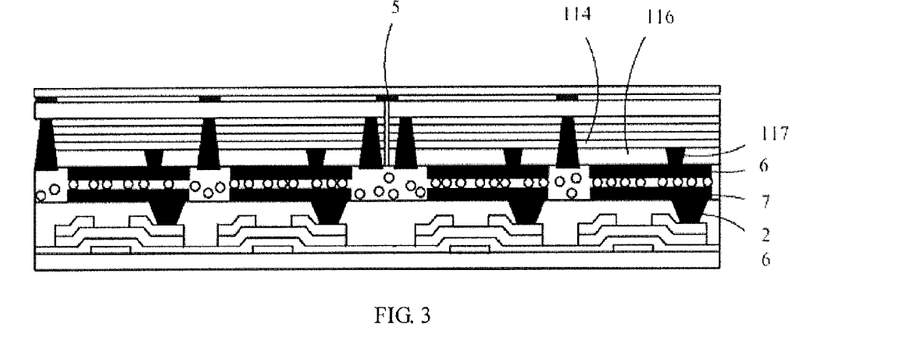
FIG. 3 is a side view of a second structure of a tiled OLED display according to an embodiment of the present invention.
Figure 4:
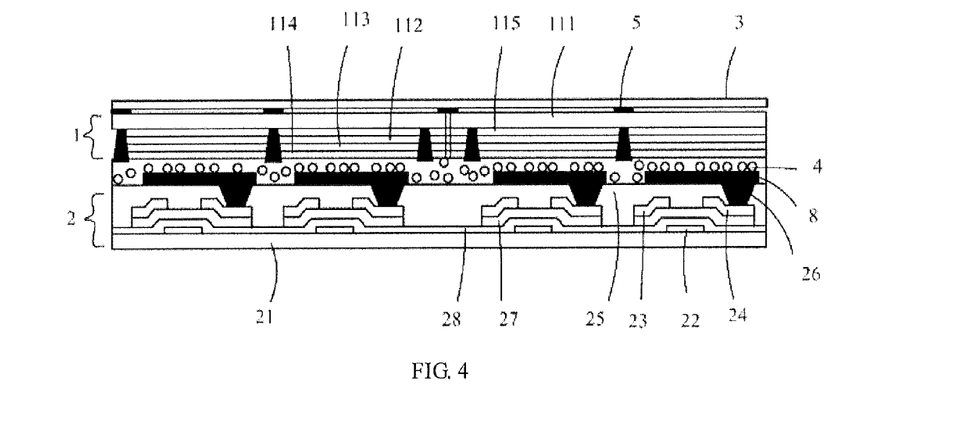
FIG. 4 is a side view of a third structure of a tiled OLED display according to an embodiment of the present invention.

FIG. 1 is a schematic structure of a tiled OLED display in the present invention. FIGS. 2-4 are respectively side views of a first, second, and third structure of the tiled OLED display provided in this embodiment. For ease of description, only a part relevant to this embodiment is shown. As shown in FIG. 1 and FIG. 2, the tiled OLED display includes an OLED front panel 1 and a TFT driving backplane 2 configured to drive the OLED front panel 1 to emit light, where a protection substrate 3 is further disposed on a light-emitting side of the OLED front panel 1. The TFT driving backplane 2 is a single structure. The OLED front panel 1 is a tiled structure obtained by tiling multiple OLED front panel units 11. Each of the OLED front panel units 11 is attached to the TFT driving backplane 2 by a conductive film 4, so as to form the flat OLED front panel 1 on the TFT driving backplane 2, where the conductive film 4 is preferably an anisotropic conductive film.

Under above simple structure, the tiled OLED display of the present invention eliminates multiple defects of a traditional tiled OLED display. Firstly, as the OLED front panel 1 is obtained by tiling multiple OLED front panel units 11 of a relatively small size and of relatively high yield rate, the yield rate of the OLED front panel 1 which is obtained by tiling multiple OLED front panel units 11 is thus much higher than the yield rate obtained by producing a single OLED front panel having the same size of the front panel 1 on the TFT driving backplane 2 directly. Therefore, in the present application, the manufacturing efficiency and yield rate of the tiled OLED display are improved, further, the cost is reduced.

Secondly, the above structure eliminates tiling gaps caused by a row/column scan drive circuit on TFT driving backplane 2, thereby reducing the width of the tiling gap, which is favorable for implementing seamless tiling. In addition, compared with a traditional structure that uses an optical lens to eliminate a tiling gap, the cost is reduced. Meanwhile, the potential impact resulting from bad alignment between the lens and the display is avoided, thereby improving the yield rate of the tiled OLED display.

Thirdly, use of a hard contact partition wall is avoided under the solution that the OLED front panel 1 is attached to the TFT driving backplane 2 by the conductive film 4, thereby increasing an effective light-emitting area of the OLED front panel unit 11, improving a display aperture ratio, and further improving the display effect of the tiled display. In addition, the conductive film 4 improves the effective contact between the OLED front panel unit 11 and the TFT driving backplane 2, which overcomes a problem in the prior art that it is difficult to control alignment precision due to metal hard contact, assembling is difficult, and joint stability is poor. The service life of the display is thus extended. In addition, the conductive film 4 is completely arranged between the entire TFT driving backplane 2 and the multiple OLED front panel units 11, so that implementation is simpler, and there is no risk of short-circuiting between neighboring pixels. Moreover, it is further favorable for producing a flexible display by joining the OLED front panel 1 to the TFT driving backplane 2 by using the conductive film 4.

In conclusion, a large-sized OLED display is implemented in the prior art by producing an OLED light-emitting panel whose size is the same as a single-structure TFT driving backplane. However, in this method, problems of high cost and low yield rate exist. In order to resolve the problem, a manner in which tiling is directly performed by using multiple displays is proposed in the prior art. However, because tiling is performed by using complete display units, that is, a row/column scan drive circuit exists on an edge of each of the displays, seamless tiling cannot be implemented. In order to resolve the problem, it is further proposed that an optical lens array is used to magnify an image to the border of the tiled display, so as to implement visual seamlessness. However, according to the tiled OLED display provided in the present invention, the OLED light-emitting panel of large size is acquired by tiling the OLED front panel units having relatively small size. In addition, when the OLED front panel units have been attached to the single-structure TFT driving backplane, real seamless tiling is implemented, and the problem existing in the prior art is resolved.

Refer to FIG. 3, as a preferable solution, a shielding part 5 that is in a one-to-one correspondence with a tiling gap between the OLED front panel units 11 may be disposed on the protection substrate 3, that is, the shielding part 5 corresponds to adjacent edges of two adjacent OLED front panel units. The shielding parts 5 may be collectively referred to as a black matrix. In addition, the shielding part 5 may further be configured to shield a pixel partition wall 110 (shown in FIG. 2). By using the shielding part 5, impact of the tiling gap between the OLED front panel units 11 on the display effect can be completely eliminated, thereby improving display quality.

Further refer to FIG. 2. The OLED front panel unit 11 in this embodiment includes at least a transparent substrate 111, an anode layer 112, an organic material layer 113, and a cathode layer 114 that are arranged in a stack manner. A buffer layer 115 may further be disposed between the transparent substrate 111 and the anode layer 112. The TFT driving backplane 2 includes at least a support substrate 21 and a number of TFT units that are disposed on the support substrate 21, where each TFT unit includes a gate 22, a source 23, and a drain 24. A passivation layer 25 is disposed outside the TFT units, so as to protect the TFT units. It should be understood that in other embodiments, the position of the anode layer 112 and the cathode layer 114 can be reversed, that is, the OLED front panel unit can includes a transparent substrate, a cathode layer, an organic material layer, and an anode layer in serial.

In this embodiment, connection between the OLED front panel unit 11 and the TFT driving backplane 2 mainly refers to electrical connection between the cathode layer 114 of the OLED front panel unit 11 and the source 23 or the drain 24 of the TFT driving backplane 2. Specifically, the electrical connection between the cathode layer 114 and the source 23 or the drain 24 can be implemented in the following manners.

As a first implementation manner, the cathode layer 114 of the OLED front panel unit 11 may be led out by a first metal contact layer 6; while the source 23 or the drain 24 of the TFT driving backplane 2 is led out by a second metal contact layer 7. Then the first metal contact layer 6 and the second metal contact layer 7 are joined to each other by using the conductive film 4.

In this implementation manner, as shown in FIG. 2, the first metal contact layer 6 is directly disposed on a surface of the cathode layer 114 to directly electrically connect to the cathode layer 114, so as to lead out the cathode layer 114. Further refer to FIG. 3, the first metal contact layer 6 may further be indirectly electrically connected to the cathode layer 114. Specifically, a passivation layer 116 may be additionally disposed on the surface of the cathode layer 114, so as to enhance protection for the OLED front panel 1. In order to distinguish from the passivation layer 25 of the TFT driving backplane 2, in this embodiment, the passivation layer on the surface of the cathode layer 114 is named as "a first passivation layer", and the passivation layer 25 of the TFT driving backplane 2 is named as "a second passivation layer". The first passivation layer 116 has several first through holes 117, and the first through hole 117 is filled with a conductive medium, where the conductive medium may use the same material as the first metal contact layer 6. The first metal contact layer 6 is disposed on a surface of the first passivation layer 116, and is in contact with the conductive medium in the first through hole 117. The other end of the conductive medium is in contact with the cathode layer 114, so as to implement an indirect electrical connection between the first metal contact layer 6 and the cathode layer 114.

In this implementation manner, several second through holes 26 may be formed at a second passivation layer 25 of the TFT driving backplane 2, where each second through hole 26 extends from the outer surface of the second passivation layer 25 to the source 23 or the drain 24, and is filled with a conductive medium. The second metal contact layer 7 is disposed on the outer surface of the second passivation layer 25, and is electrically connected to the source 23 or the drain 24 via the conductive medium in the second through hole 26. In this way, after the second metal contact layer 7 is joined to the first metal contact layer 6 by via the conductive film 4, the cathode layer 114 of the OLED front panel unit 11 is electrically connected to the source 23 or the drain 24 of the TFT driving backplane 2. In this way, the OLED pixels on each of the OLED front panel unit 11 can be driven to emit light by the TFT circuit. The first metal contact layer 6 and the second metal contact layer 7 in the present embodiment is made of metal. However, it should be understood that in other embodiment, they can be made of metal oxide such as ITO. Thus, each of these two contact layer, namely first and second metal contact layers 6 and 7 can be any conducting contact layer as long as it can perform the conducting function. This conducting contact layer should be also applicable to the metal contact layer 8 mentioned below.

As a another implementation manner, as shown in FIG. 4, a metal contact layer (a third metal contact layer 8) may be disposed only on the TFT driving backplane 2, and the OLED front panel unit 11 is not provided with a metal contact layer. In addition, the third metal contact layer 8 on the TFT driving backplane 2 may still lead out the source 23 or the drain 24 of the TFT driving backplane 2 by using the conductive medium in the second through hole 26, and is directly electrically connected to the cathode layer 114 of the OLED front panel unit 11 via the conductive film 4. In this implementation manner, the cathode layer 114 is not only treated as a necessary functional structure layer of the OLED front panel unit 11, but also has the same function as the foregoing first metal contact layer 6. Manufacturing the first metal contact layer 6 is not required in this structure, thereby simplifying the manufacturing process, reducing a cost, and reducing thickness of the display.

Figure 5:
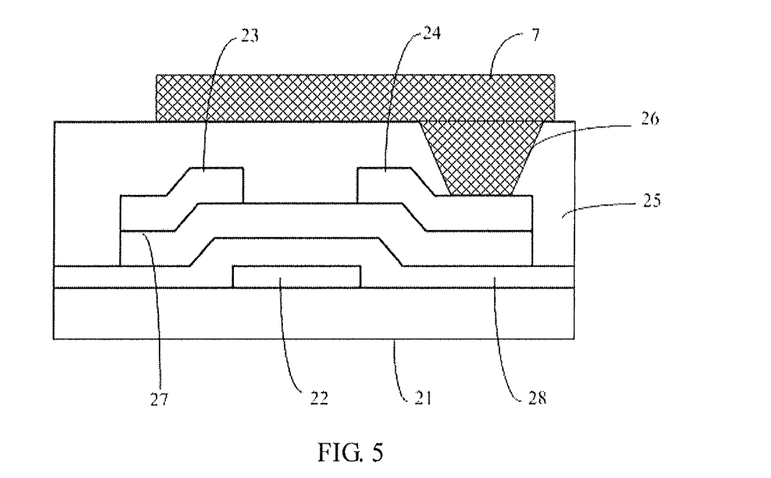
FIG. 5 is a schematic structural of a TFT driving backplane according to an embodiment of the present invention.
Figure 6:
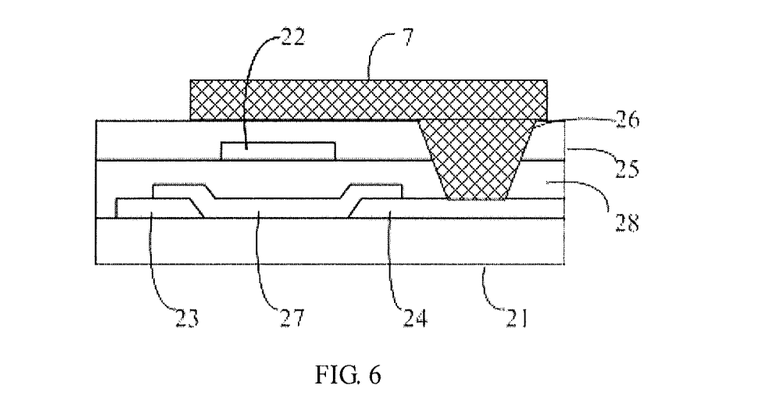
FIG. 6 is another schematic structural of a TFT driving backplane according to an embodiment of the present invention.

In this embodiment, the TFT unit of the TFT driving backplane 2 is a bottom gate structure (the gate 22 is close to the support substrate 21) or a top gate structure (the gate 22 is far away from the support substrate 21, and the source 23 and the drain 24 are close to the support substrate 21). As shown in FIG. 5, when the TFT unit is of a bottom gate structure, starting from the support substrate 21, the gate 22, an insulation layer 28, a semiconductor layer 27, and the source 23 and the drain 24 are sequentially disposed to form the TFT unit. In this case, the second through hole 26 penetrates the second passivation layer 25. As shown in FIG. 6, if it is a top gate structure TFT unit, starting from the support substrate 21, the source 23 and the drain 24, a semiconductor layer 27, an insulation layer 28, and the gate 22 are sequentially disposed to form the TFT unit. In this case, the second through hole 26 penetrates the second passivation layer 25 and the insulation layer 28. Displays shown in FIGS. 2-4 all use a TFT unit of the bottom gate structure.

The foregoing only provides several specific structures of an OLED display, but the present invention is not limited to the foregoing structures. Any display that is obtained by tiling OLED front panel units on a single-structure TFT driving backplane, where each of the OLED front panel units is tiled on the TFT driving backplane by conductive film, shall fall within the protection scope of the present invention.

The present invention further provides a method for producing the foregoing tiled OLED display. The method includes the following steps, and specific reference may be made to a flowchart shown in FIG. 7 and a structural diagram shown in FIG. 2.

Figure 7:
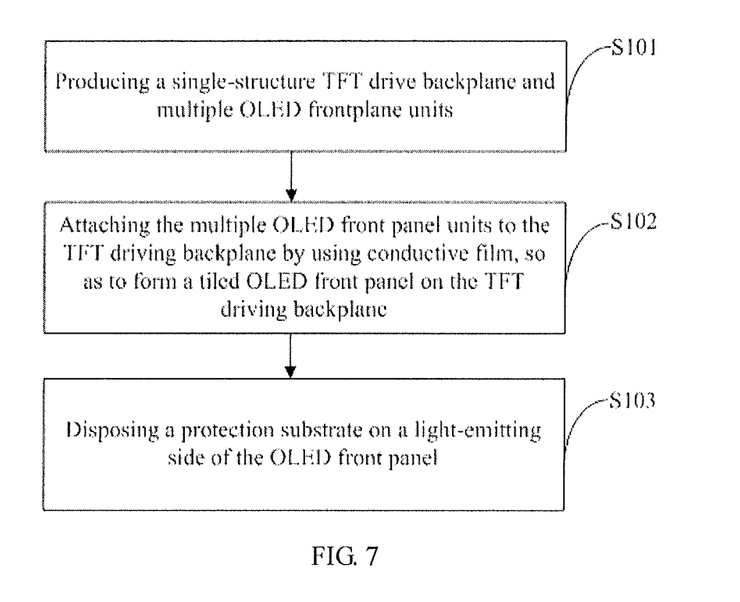
FIG. 7 is a flowchart of producing a tiled OLED display according to an embodiment of the present invention.

Step S101: Producing a single-structure TFT driving backplane and multiple OLED front panel units.

In this step, the OLED front panel unit 11 includes at least a transparent substrate 111, an anode layer 112, an organic material layer 113, and a cathode layer 114 that are sequentially arranged in a stack manner. Further, a passivation layer (first passivation layer 116, shown in FIG. 3) may further be disposed on a surface of the cathode layer 114, so as to protect an internal structure. The TFT driving backplane 2 includes at least a support substrate 21, where a gate 22, a source 23, and a drain 24 are disposed on the support substrate 21, so as to form a TFT unit. A passivation layer (second passivation layer 25) is disposed outside the TFT unit, and is used to protect the TFT unit inside.

Further, several through holes (second through hole 26) may be disposed at the second passivation layer 25, which makes it convenient to subsequently join an OLED front panel 1 to the TFT driving backplane 2. In addition, the size of the TFT driving backplane 2 can be determined according to the size of the OLED display that is to be actually produced, and the size of the OLED front panel unit 11 can be determined according to a difficulty of a manufacturing process and with reference to a size obtained after tiling.

Step S102: Attaching the multiple OLED front panel units 11 to the TFT driving backplane 2 by a conductive film 4, so as to form a tiled OLED front panel 1 on the TFT driving backplane 2.

In this embodiment, after the OLED front panel 1 is attached to the TFT driving backplane 2, the electrical connection between the two is be mainly represented by an electrical connection between the cathode layer 114 of OLED front panel unit 11 and the source 23 or the drain 24 of the TFT driving backplane 2.

Step S103: Disposing a protection substrate 3 on a light-emitting side of the OLED front panel 1.

Preferably, a shielding part 5 may be disposed on the protection substrate 3. Specifically, a substrate may be firstly disposed on the light-emitting side of the OLED front panel 1, and then the shielding part 5 is disposed at a corresponding position on the substrate. Alternatively, the shielding part 5 may also be firstly disposed on the substrate according to a preset position of a tiling gap, and then the protection substrate 3 on which the shielding part is already disposed is disposed on the light-emitting side of the OLED front panel 1.

Further, in the foregoing step S102, the electrical connection between the cathode layer 114 of the OLED front panel unit 11 and the source 23 or the drain 24 of the TFT driving backplane 2 may be implemented in multiple manners.

Figure 8:
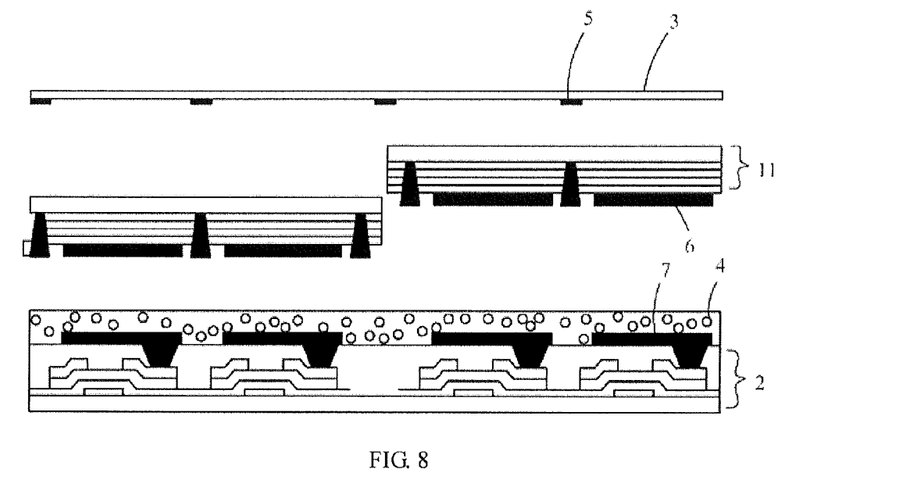
FIG. 8 schematically showing a slicing manner of a tiled OLED display according to an embodiment of the present invention.

As a first implementation manner, as shown in FIG. 8, in a situation that the first passivation layer 116 (shown in FIG. 3) is not disposed on the OLED front panel unit 11, a first metal contact layer 6 may be disposed at the cathode layer 114 (shown in FIG. 2) of the OLED front panel unit 11, and a second metal contact layer 7 may be disposed at the second passivation layer 25 (shown in FIG. 2) of the TFT driving backplane 2. In addition, the second metal contact layer 7 leads out the source 23 or the drain 24 via the second through hole 26 at the second passivation layer 25 of the TFT driving backplane 2. Specifically, a conductive medium may be filled in advance in the second through hole 26 at the second passivation layer 25 of the TFT driving backplane 2, so that the conductive medium is in contact with the source 23 or the drain 24. When being disposed, the second metal contact layer 7 is in contact with the conductive medium, so as to lead out the source 23 or the drain 24. Alternatively, when the second metal contact layer 7 has been disposed, a material that forms the second metal contact layer may also be filled in the second through hole 26, so that the source 23 or the drain 24 can be still led out. Then, the conductive film 4 is panted on a surface of the first metal contact layer 6 and/or a surface of the second metal contact layer 7, and then the first metal contact layer 6 and the second metal contact layer 7 are attached to each other to form a display of the structure shown in FIG. 2.

Figure 9:
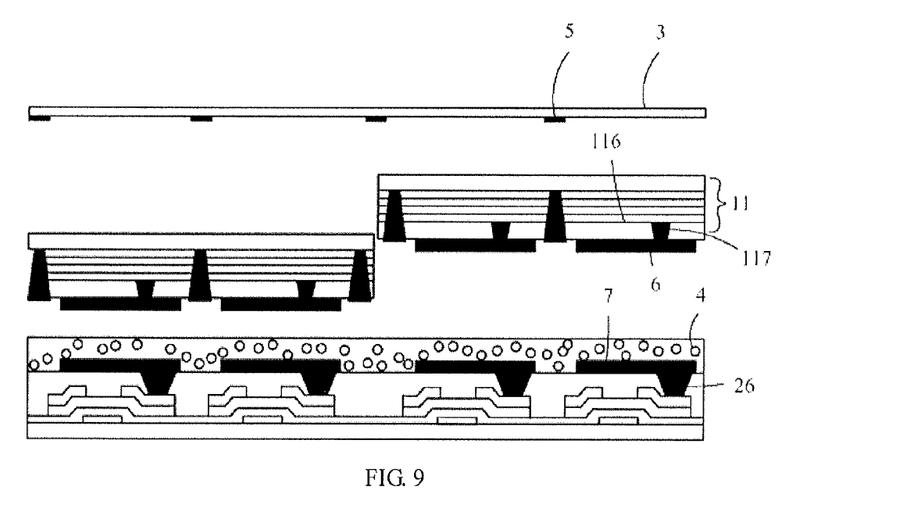
FIG. 9 schematically showing another slicing manner of a tiled OLED display according to an embodiment of the present invention.

As a second implementation manner, as shown in FIG. 9, in the situation that the first passivation layer 116 is disposed on the OLED front panel unit 11, several through holes (first through hole 117) may be formed at the first passivation layer 116 in advance; then, the first metal contact layer 6 is disposed at the first passivation layer 116, and the first through hole 117 is filled up with a metal material, so as to lead out the cathode layer 114. Afterwards, the first metal contact layer 6 is connected to the second metal contact layer 7 on the TFT driving backplane 2 by the conductive film 4, so as to form a display of the structure shown in FIG. 3.

As a third implementation manner, in the situation that the first passivation layer 116 is not disposed on the OLED front panel unit 11, a metal contact layer (third metal contact layer 8, shown in FIG. 4) may be disposed only on the TFT driving backplane 2; while no metal contact layer is disposed on the OLED front panel unit 11. The cathode layer 114 is directly connected to the third metal contact layer 8 on the TFT driving backplane by the conductive film 4, so as to form a display of the structure shown in FIG. 4.

In the method provided in the present invention, an OLED front panel is tiled on a single-structure TFT driving backplane, so as to form a structure obtained by tiling a front panel on a single backplane. Compared with a method that an OLED front panel of the same size as a TFT driving backplane is directly produced on the TFT driving backplane, the foregoing method has a higher yield rate and manufacturing efficiency and a lower cost. In addition, in the method, a tiling gap caused by a row/column scan drive circuit is eliminated, thereby implementing seamless tiling. Moreover, compared with a traditional structure that uses an optical lens to eliminate a tiling gap, the cost is reduced. Meanwhile, the potential impact resulting from bad alignment between the lens and the display is avoided, thereby further improving the yield rate of a tiled OLED display.

Furthermore, use of a contact partition wall is avoided under the solution that the OLED front panel is attached to the TFT driving backplane by conductive film, thereby increasing an effective light-emitting area of an OLED front panel unit, improving a display aperture ratio, and further improving a display effect of the tiled display. In addition, the conductive film improves the effective contact between the OLED front panel unit and the TFT driving backplane, thereby overcoming a problem in the prior art that it is difficult to control alignment precision caused by hard contact of metal, assembling is difficult, and joint stability is poor. The service life of the display is thus extended. Moreover, it is further favorable for producing a flexible display by joining the OLED front panel to the TFT driving backplane by using the conductive film.

The foregoing descriptions are merely exemplary embodiments of the present invention, but are not intended to limit the present invention. Any modification, equivalent replacement, and improvement made without departing from the spirit and principle of the present invention should fall within the protection scope of the present invention.

What is claimed is:

1. A tiled organic light-emitting diode LED) display, comprising:
   one single-structure TFT driving backplane;
   an OLED front panel comprising multiple OLED front panel units tiled to each other, wherein the OLED front panel units include a transparent substrate, a first electrode layer, an organic material layer, and a second electrode layer that are sequentially arranged in a stacked manner;
   a conductive film coupling each of the OLED front panel units to the one TFT driving backplane; and
   a protection substrate disposed on a light-emitting side of the OLED panel,
   wherein the second electrode layer is electrically connected to a source or a drain of the TFT driving backplane by using the conductive film, and
   the second electrode layer is led out by using a first conducting contact layer, the source or the drain of the TFT driving backplane is led out by using a second conducting contact layer, the first conducting contact layer and the second conducting contact layer are joined to each other by the conductive film.

2. The tiled OLED display according to claim 1, wherein a shielding part that is in a one-to-one correspondence with a tiling gap between the OLED front panel units is disposed on the protection substrate.

3. The tiled OLED display according to claim 1, wherein the conductive film is an anisotropic conductive film.

4. The tiled OLED display according to claim 1, wherein the first conducting contact layer is disposed on a surface of the second electrode layer.

5. The tiled OLED display according to claim 1, wherein a first passivation layer that has a first through hole is disposed on a surface of the second electrode layer, wherein the first through hole is filled with a conductive medium; and the first conducting contact layer is disposed on a surface of the first passivation layer and is electrically connected to the second electrode layer by using the conductive medium.

6. The tiled OLED display according to claim 1, wherein the TFT driving backplane comprises a support substrate, a TFT unit that is disposed on the support substrate and comprises a gate, the source, and the drain, and a second passivation layer disposed outside the TFT unit;
    a second through hole is disposed between the second passivation layer and the source or the drain, and the second through hole is filled with a conductive medium; and
    the second conducting contact layer is disposed on a surface of the second passivation layer, and is electrically connected to the source or the drain by using the conductive medium in the second through hole.

7. The tiled OLED display according to claim 1, wherein the source or the drain of the TFT driving backplane is led out by using a third conducting contact layer, and the second electrode layer and the third conducting contact layer are joined to each other by using the conductive film.

8. A method for producing a tiled OLED display, wherein the method comprises:
    producing a single-structure TFT driving backplane and multiple OLED front panel units;
    attaching each of the multiple OLED front panel units to the one TFTl7 driving backplane by using conductive film, so as to form a tiled OLED front panel on the TFT driving backplane; and
    disposing a protection substrate on a light-emitting side of the OLED front panel,
    wherein attaching the multiple OLED front panel units to the TFT driving backplane by using conductive film includes:
        disposing a first conducting contact layer on the OLED front panel unit, so as to lead out the second electrode layer;
        disposing a second conducting contact layer on the TFT driving. backplane so as to lead out a source or a drain of the TFT driving backplane; and
        joining the first conducting contact layer to the second conducting contact layer by using the conductive film.

9. The method according claim 8, wherein a shielding part that is in a one-to-one correspondence with a tiling gap between the OLED front panel units is disposed on the protection substrate.

10. The method according to claim 8, wherein the OLED front panel unit comprises a transparent substrate, a first electrode layer, an organic material layer, and a second electrode layer that are sequentially arranged in a stacked manner.

11. The method according to claim 8, wherein the first conducting contact layer is disposed on a surface of the second electrode layer.

12. The method according to claim 8, wherein a passivation layer is further disposed on a surface of the second electrode layer, wherein the passivation layer has a through hole filled with a conductive medium; and the first conducting contact layer is disposed on a surface of the passivation layer, and is electrically connected to the second electrode layer by using the conductive medium in the through hole.

13. The method according to claim 8, wherein attaching the multiple OLED front panel units to the TFT driving backplane by using conductive film includes:
    disposing a third conducting contact layer on the TFT driving backplane, so as to lead out a source or a drain of the TFT driving backplane; and
    joining a second electrode layer of the MED front panel unit to the third conducting contact layer on the TFT driving backplane by using the conductive film.

\* \* \* \* \*